United States Patent
Gwin et al.

(10) Patent No.: US 6,749,012 B2
(45) Date of Patent: Jun. 15, 2004

(54) LIQUID COOLING SYSTEM FOR PROCESSORS

(75) Inventors: Paul J. Gwin, Orangevale, CA (US); Rolf A. Konstad, Gold River, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/136,503

(22) Filed: Apr. 30, 2002

(65) Prior Publication Data

US 2003/0201092 A1 Oct. 30, 2003

(51) Int. Cl.[7] ................................................ H05K 7/20
(52) U.S. Cl. ................ 165/80.4; 165/104.33; 165/122; 361/699
(58) Field of Search ............... 165/80.4, 104.33, 165/104.21, 122, 132; 361/699; 257/714

(56) References Cited

U.S. PATENT DOCUMENTS

| | | | | |
|---|---|---|---|---|
| 3,481,393 A | * | 12/1969 | Chu | .................... 165/80.4 |
| 3,817,321 A | * | 6/1974 | Von Cube et al. | ...... 165/104.22 |
| 4,706,739 A | * | 11/1987 | Noren | ................... 165/104.14 |
| 5,014,904 A | * | 5/1991 | Morton | ........................ 228/176 |
| 5,043,797 A | * | 8/1991 | Lopes | .......................... 257/714 |
| 5,052,472 A | * | 10/1991 | Takahashi et al. | .......... 165/299 |
| 5,323,847 A | * | 6/1994 | Koizumi et al. | ........ 165/104.33 |
| 6,064,570 A | * | 5/2000 | Wang et al. | ................. 361/695 |
| 6,148,860 A | * | 11/2000 | Sigler | .......................... 137/846 |
| 6,351,381 B1 | * | 2/2002 | Bilski et al. | ................. 361/695 |
| 6,447,270 B1 | * | 9/2002 | Schmidt et al. | ............. 417/366 |
| 2003/0056939 A1 | * | 3/2003 | Chu et al. | .................. 165/80.4 |

* cited by examiner

Primary Examiner—Allen Flanigan
(74) Attorney, Agent, or Firm—Trop, Pruner & Hu, P.C.

(57) ABSTRACT

A cooling system for a processor-based system may include a housing that contains a heat exchanger, a tank, and an internal pump that pumps fluid through the heat exchanger and through a cooling plate coupled thermally to a processor to be cooled.

17 Claims, 3 Drawing Sheets

LIQUID COOLING SYSTEM FOR PROCESSORS

BACKGROUND

This invention relates generally to processor-based systems and, particularly, to liquid cooling of processor-based systems.

Processor performance is directly related to the temperature of the processor. A variety of air and liquid cooling techniques are known to decrease processor temperature. Liquid cooling techniques generally allow greater cooling efficiency, but have a number of drawbacks.

Liquid cooling techniques may take up too much of the available size inside the housing of the processor-based system. In addition, they tend to be more expensive. Liquid cooling techniques also may be prone to leakage, and leakage would adversely affect the operation of most electrical components within the processor-based system.

Thus, there is a need for better ways to provide liquid cooling for processor-based systems.

DETAILED DESCRIPTION

Figure 1:
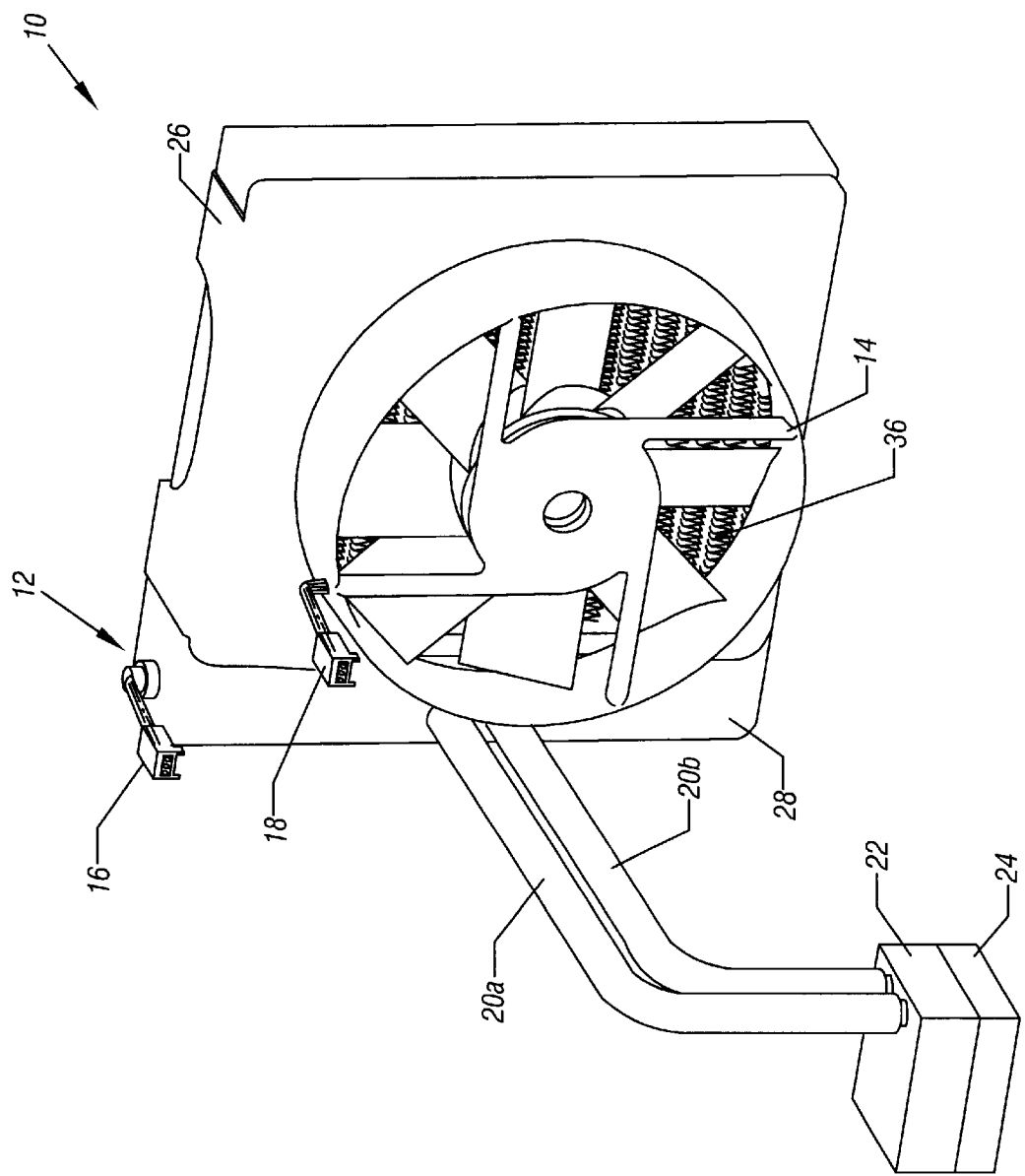
FIG. 1 is a perspective view of one embodiment of the present invention.
Figure 2:
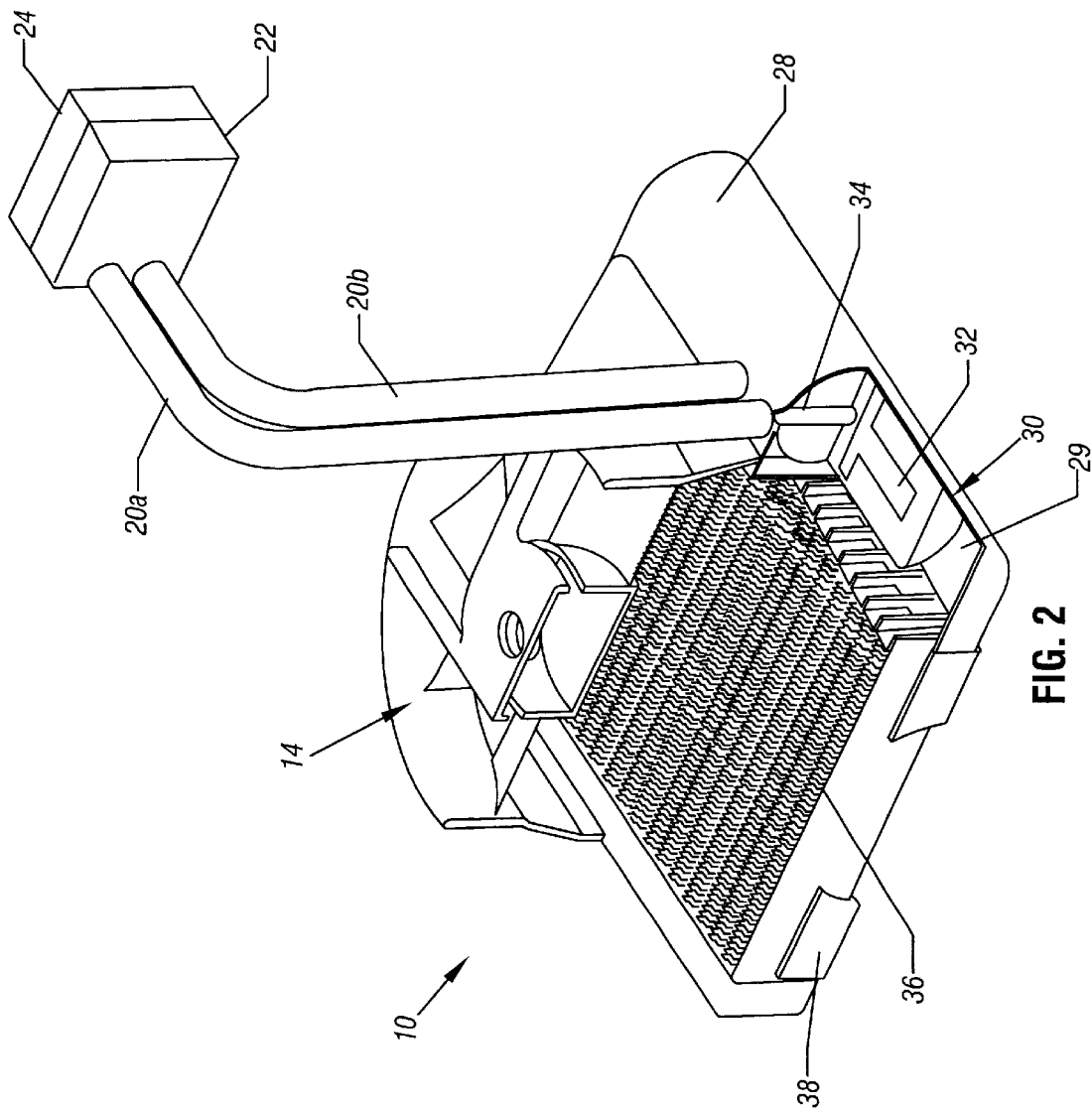
FIG. 2 is a partially cut-away view of the embodiment shown in FIG. 1.

Referring to FIG. 1, a liquid cooling system 10 for a processor-based system may include a housing 12 that houses a heat exchanger core 36 and a liquid pump (not shown in FIG. 1). Secured to the housing 12 is a fan assembly 26 including a fan 14. The fan 14 is positioned over an opening in the housing 12 to provide air cooling of liquid inside a heat exchanger core 36. The heat exchanger core 36 is defined in part by opposed faces separated a given amount to define a thickness direction, as shown in FIG. 2. The fan 14 may be coupled to an electrical potential through a connector 18. The liquid pump may be coupled to an electrical potential through a connector 16. A portion 28 of the housing 12 may comprise a tank or reservoir for the pumped, cooling liquid.

The cooled liquid, passing out of the housing 12, may pass through a pipe 20b to a processor cold plate 22 and then back through return pipe 20a. A processor 24 of a processor-based system may be in thermal contact with the cold plate 22.

The liquid is drawn from the tube 34, shown in FIG. 2, to the left through the heat exchanger core 36. The fan 14 flows air across the heat exchanger core 36 in the thickness direction to cool the liquid inside the heat exchanger core 36. A pump 30, shown in FIG. 2, pumps the liquid outwardly through the pipe 20b to cool the cold plate 22 and then back through the pipe 20a and the tube 34, and the cycle repeats. On the far side of the heat exchanger 36, the flow does a u-turn and flows to the right in FIG. 2 along the rear end of the housing 10, through another section of the heat exchanger core 36, to the reservoir 28. From one reservoir 28, the cooled liquid flows through the pipe 20a to the cold plate 22.

Because the pump is integrally formed within the housing 12, the size of the entire cooling system 10 is reduced in some embodiments. In addition, the adverse consequences of a leak may be reduced because any leak arising between the pump and other components may be contained by the housing 12. In addition, the part count of the system 10 may be reduced because the amount of tubing that is needed between the pump and the rest of the components may be reduced. Namely, the pump may simply be positioned within the reservoir that provides the cooling liquid.

Referring to FIG. 2, the pump 30 may be positioned within an outlet reservoir portion 29 of the housing 12. The pump 30 may include an impeller 32 and a tube 34 that communicates with the tube 20a. Note that the tube 34 is entirely within the housing 12 and, therefore, any leak between the impeller 28 and the tube 34 is contained by the housing 12. The portion 29 surrounding the pump 30 constitutes a tank for supplying the liquid to be cooled to the heat exhanger core 36.

The fan assembly 26 may simply be attached, for example, by a removable connection or welding to the housing 12. In some embodiments, the fan assembly 26 may be replaced without replacing the entire cooling system 10. Clips 38 may be utilized to secure the fan assembly 26 to the housing 12, either removably or permanently.

Figure 3:
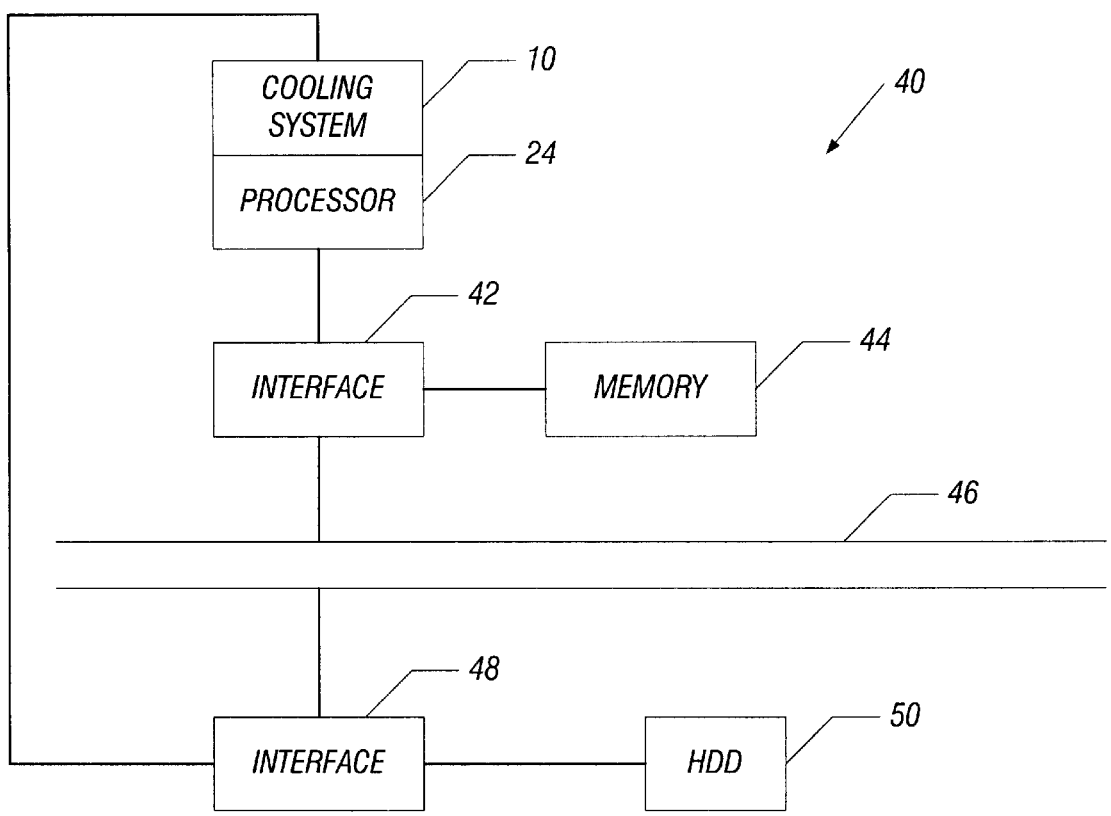
FIG. 3 is a schematic depiction of one embodiment of the present invention.

Referring to FIG. 3, a processor-based system 40 may include the processor 24 thermally coupled to the cooling system 10. The processor 24 may be electrically coupled to an interface 42, such as a bridge. The interface 42 is coupled to a memory 44 and a bus 46. The bus 46 may, in turn, be coupled to another interface 48, such as a bridge. The interface 48 may also be coupled to a hard disk drive 50 in one embodiment.

In some embodiments, the interface 48 may provide electrical signals to the cooling system 10 to control its operation. For example, based on the performance or temperature of the processor 24, additional cooling may be provided under control of the interface 48. Thus, signals may be provided to the connectors 18 and 16 to control the fan 14 and pump 30 to achieve a desired processor 24 temperature.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    providing a housing with an opening;
    mounting a heat exchanger in housing, said heat exchanger comprising a core defined in part by opposed faces separated a given amount in a thickness direction;
    mounting a fan in said opening;
    providing a liquid coolant tank within said housing;
    providing a pump within said tank within said housing;
    providing a cooling plate and tubing to couple said pump to said cooling plate; and
    causing air flow from said fan across said heat exchanger in said thickness direction.

2. The method of claim 1 including attaching a fan to said housing.

3. The method of claim 2 including attaching said fan over an opening in said housing.

4. The method of claim 1 including coupling said cooling plate to a processor.

5. The method of claim 1 including providing said heat exchanger with a shorter and a longer dimension.

6. The method of claim 5, wherein causing air to flow from said fan through said heat exchanger including causing air to flow from said fan through said heat exchanger in the shorter dimension of said heat exchanger.

7. A cooling system for a processor-based system comprising:
- a housing with an opening;
- a reservoir for cooling liquid in said housing;
- a heat exchanger in said housing, said heat exchanger comprising a core defined in part by opposed faces separated a given amount in a thickness direction;
- a pump in said reservoir to pump liquid through said heat exchanger;
- a cooling plate coupled to said pump to receive said liquid; and
- a fan secured in said opening in said housing over said heat exchanger to cause air flow from said fan across said heat exchanger in said thickness direction.

8. The system of claim 7 including an opening in said housing over said heat exchanger.

9. The system of claim 8 wherein said fan secured to said housing to flow air over said heat exchanger.

10. The system of claim 7, wherein said heat exchanger having a shorter and a longer dimension.

11. The system of claim 10, wherein said fan is disposed across said heat exchanger for air to flow from said fan through said heat exchanger in the shorter dimension of said heat exchanger.

12. A processor-based system comprising:
- a processor;
- an interface coupled to said processor; and
- a cooling system coupled to said interface to control the temperature of said processor, said cooling system including a housing with an opening, a reservoir for cooling liquid in said housing, a heat exchanger in said housing, said heat exchanger comprising a core defined in part by opposed faces separated a given amount in a thickness direction, a pump in said reservoir to pump liquid through said heat exchanger, a cooling plate coupled to said pump, and a fan secured in said opening in said housing over said heat exchanger to cause air flow from said fan across said heat exchanger in said thickness direction.

13. The system of claim 12 including an opening in said housing over said heat exchanger.

14. The system of claim 13 including a fan secured to said housing to flow air over said heat exchanger.

15. The system of claim 12 including a bus coupled to said interface.

16. The system of claim 12, wherein said heat exchanger having a shorter and a longer dimension.

17. The system of claim 16, wherein said fan is disposed across said heat exchanger for air to flow from said fan through said heat exchanger in the short dimension of said heat exchanger.

* * * * *